United States Patent
Watanabe

(10) Patent No.: US 7,935,592 B2
(45) Date of Patent: May 3, 2011

(54) METHOD OF MANUFACTURING SEMICONDUCTOR DEVICE HAVING OF SPACER GATE STRUCTURE

(75) Inventor: Takashi Watanabe, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 420 days.

(21) Appl. No.: 11/980,554

(22) Filed: Oct. 31, 2007

(65) Prior Publication Data

US 2008/0099859 A1    May 1, 2008

(30) Foreign Application Priority Data

Nov. 1, 2006  (JP) ................. 2006-297774

(51) Int. Cl.
*H01L 21/8238* (2006.01)
(52) U.S. Cl. ........ 438/230; 438/199; 438/229; 438/231; 438/788; 257/E29.266
(58) Field of Classification Search .................. 438/199, 438/229, 230, 231, 788; 257/E29.266
See application file for complete search history.

(56) References Cited

U.S. PATENT DOCUMENTS

| 7,060,559 | B2 * | 6/2006 | Ozawa et al. | 438/257 |
| 7,378,305 | B2 * | 5/2008 | Hatada et al. | 438/153 |
| 7,410,859 | B1 * | 8/2008 | Peidous et al. | 438/231 |
| 2005/0048753 | A1 * | 3/2005 | Schwan | 438/595 |
| 2006/0024872 | A1 * | 2/2006 | Goodlin et al. | 438/196 |
| 2007/0026599 | A1 * | 2/2007 | Peidous et al. | 438/199 |
| 2007/0072380 | A1 * | 3/2007 | Wirbeleit et al. | 438/303 |
| 2008/0164530 | A1 * | 7/2008 | Wang et al. | 257/369 |
| 2008/0258175 | A1 * | 10/2008 | Peidous et al. | 257/190 |
| 2008/0283926 | A1 * | 11/2008 | Sridhar | 257/369 |

FOREIGN PATENT DOCUMENTS

| JP | 2000-216373 | 8/2000 |
| JP | 2001-250944 | 9/2001 |

* cited by examiner

*Primary Examiner* — George Fourson
*Assistant Examiner* — John M Parker
(74) *Attorney, Agent, or Firm* — McGinn IP Law Group, PLLC

(57) ABSTRACT

In a case of using a silicon nitride film as an offset spacer for forming an extension region of a transistor, an oxide protective surface is formed by oxygen plasma processing on the surface of the silicon nitride film.

10 Claims, 14 Drawing Sheets

PRIOR ART

METHOD OF MANUFACTURING SEMICONDUCTOR DEVICE HAVING OF SPACER GATE STRUCTURE

BACKGROUND OF THE INVENTION

1. Field of the Invention

The present invention relates to a method of manufacturing a semiconductor device.

2. Description of Related Art

Upon forming a field effect transistor (FET) to a semiconductor device, an LDD (Lightly Doped Drain) region with addition of an impurity at a relatively low density (also referred to as an extension region) is sometimes formed to a source—drain region. This can suppress the short channel effect. Generally, the LDD region is formed by impurity implantation using a gate electrode as a mask.

For example, Patent Document 1 (Japanese Laid-Open Patent Application No. 2000-216373) describes a constitution of disposing an offset spacer on the side wall of a gate structure for controlling the formation of an LDD region.

In a case of using the offset spacer, when a silicon nitride film is used as a material for the offset spacer, since the silicon nitride film is made of a material of more intense stress compared with a silicon oxide film, this can particularly improve the performance of an n-type channel.

Usually, plural kinds of transistors such as transistors of different conduction types or transistors of different performances are formed on a semiconductor substrate. For forming plural kinds of transistors, impurity ions have to be implanted at different steps. For this purpose, a treatment of planting ions at a step while protecting the region for forming some transistors with a resist film, then removing the resist film, implanting ions in another step while protecting the region for forming other portion of transistors with a resist film, and then removing the resist film after the implantation of ions is conducted. Further, for forming various transistors, the extension regions the respective transistors are often formed by conducting ion implantation treatment for plural times.

However, a silicon nitride film involves a problem of causing film reduction upon removal of resist. Particularly, when an SPM (mixed solution of sulfuric acid and aqueous hydrogen peroxide) treatment is conducted, the film reduction occurs remarkably. In the offset spacer structure used in the process after the 90 nm node, when the width of the offset spacer formed to the gate side wall changes even by several Å for controlling the overlap length between the gate and the extension region, the transistor characteristics fluctuate greatly and a desired transistors can no more be obtained. Accordingly, for reducing the variation in manufacture, it is important to suppress the change of the film thickness of the offset spacer.

FIGS. 7a and 7b illustrate cross sectional views of a related art.

A semiconductor device 1 includes a semiconductor substrate 2, a gate insulation film 10 formed thereon, a gate electrode 12 formed on the gate insulation film 10, and an offset spacer 14 formed on the side wall of the gate electrode and constituted with a silicon nitride film (FIG. 7a). In a case of conducting ion implantation while once protecting a transistor formed in other region with a resist film and then the resist film is removed, film reduction is caused to the offset space 14 constituted with the silicon nitride film under the effect of the SPM treatment upon removal of the resist film (FIG. 7b). Particularly, the silicon nitride film is etched at an upper portion where it tends to be exposed to the chemical solution, which makes the offset spacer 14 into a tapered shape.

As has been described above, while the offset spacer 14 is provided for controlling the overlap length between the gate and the extension region, it requires a thickness to some extent, for example, a height of about 30 nm or more in order to function as an offset spacer. In a portion where the height of the offset spacer is not sufficient, ions pass and are injected into the semiconductor substrate 2 upon ion implantation. Accordingly, the overlap length between the gate and the extension region is not formed as designed. Accordingly, fine control of the transistor characteristic is difficult.

Patent Document 1 discloses a procedure of conducting an annealing treatment of a thin oxide at a temperature of about 800° C. for annealing the substrate and the gate structure after forming an offset spacer on the side wall of a gate structure. It is described that the offset spacer can protect the gate structure during a thin oxide annealing treatment to prevent formation of birds beak at the boundary between the gate oxide layer and the gate conductor layer.

However, in the technique described in Patent Document 1, a thin oxide annealing treatment is conducted at a high temperature (about 800° C.) after forming the offset spacer. Accordingly, in a case where a gate electrode is constituted for example with polysilicon and impurities are diffused in the polysilicon, diffusion of the impurities may possibly cause diffusion of the impurities between the N-type MOS region and the P-type MOS region to each other, or break through of the impurities through the gate electrode. This results in a problem of causing the diffusion of the impurities to deteriorate the characteristics of transistors.

Patent document 2 (Japanese Laid-Open Patent Application No. 2001-250944) describes a technique of forming a silicon nitride film so as to cover a polysilicon gate and applying a heat treatment in an oxidative atmosphere thereby forming a silicon oxynitride film, anisotropically etching the film to form a side wall in which the silicon nitride film and the silicon oxynitride film are stacked in this order. It is described that deposition of silicon pieces on the surface of the side wall can be prevented upon forming a selective silicon film of a predetermined thickness in a source—drain region by an epitaxial growing method.

However, this document 2 does not disclose a LDD structure. Therefore, the technology of this document 2 does not relate to a transistor having a LDD structure.

SUMMARY OF THE INVENTION

As to an aspect of the present invention, a semiconductor device is formed by the following steps, comprising:

forming a gate electrode on a semiconductor substrate;

forming a silicon nitride film on a side surface of the gate electrode;

forming an oxide film on the nitride film, the oxide film and the nitride film constituting an offset spacer of the gate electrode, and introducing an impurity into the semiconductor substrate, by using the offset spacer as a mask, to form a lightly doped drain region for the gate electrode.

With the constitution described above, since the oxide film is formed on the surface even in a case of constituting the offset spacer with a silicon nitride film, the reduction of the offset spacer can be prevented even when the SPM chemical solution is used to remove the resist film. This can maintain the width that functions as the offset spacer as desired and control the overlap length between the gate and the extension region controlled to a desired value. Further, diffusion of the impurity due to the high temperature treatment can be decreased. They can reduce the variation in the manufacture of the transistor characteristics. According to the invention, a transistor having desired characteristic can be formed at a good accuracy.

BRIEF DESCRIPTION OF THE DRAWINGS

The above and other aspects, advantages and features of the present invention will be more apparent from the following description of certain exemplary embodiments taken in conjunction with the accompanying drawings, in which.

DETAILED DESCRIPTION OF THE EXEMPLARY EMBODIMENT

First Embodiment

Figure 1A:
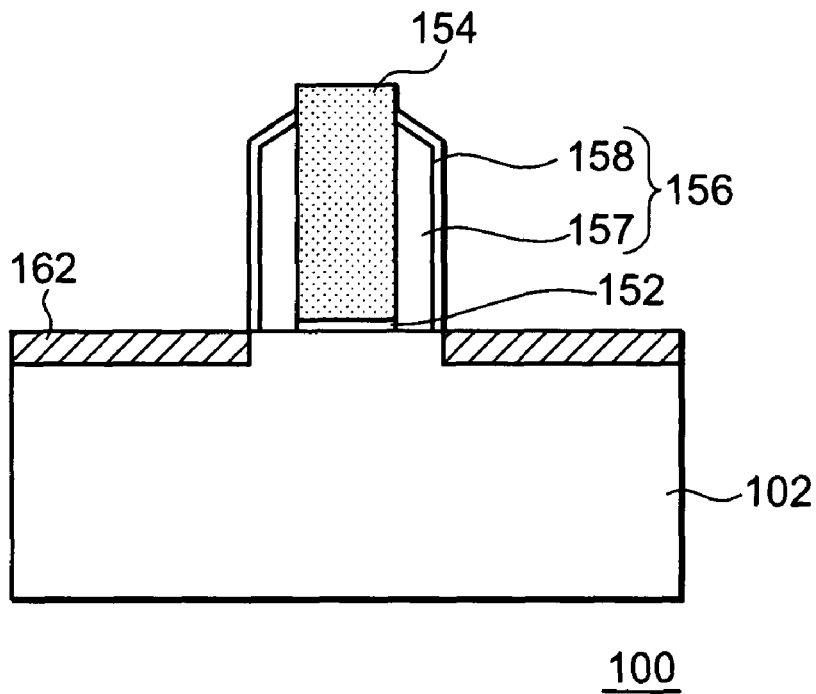
FIGS. 1a and 1b are cross sectional views showing the constitution of a semiconductor device in an embodiment of the invention.
Figure 1B:
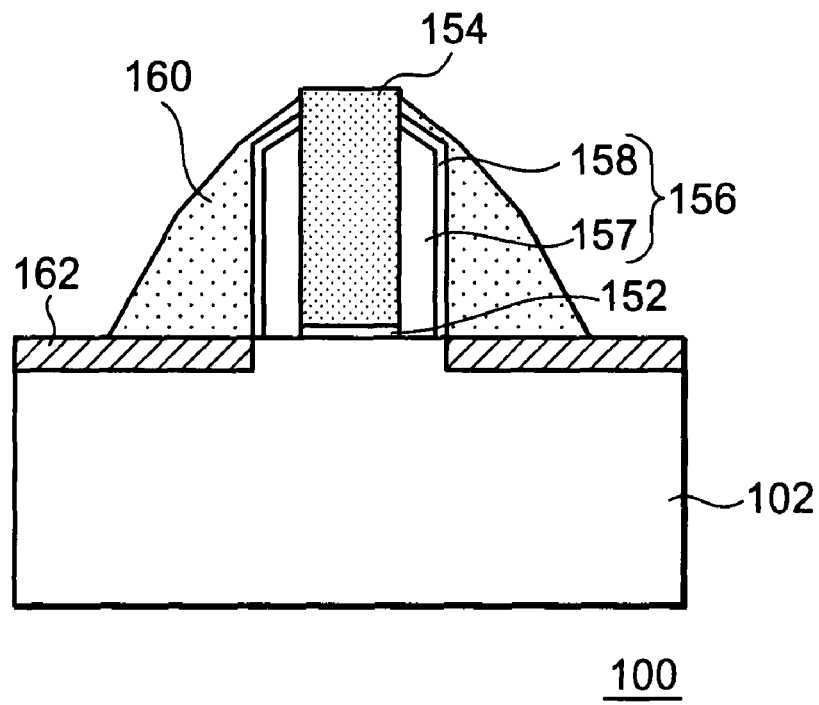

FIGS. 1a and 1b are cross sectional views of a semiconductor device 100 according to a first embodiment of the present invention.

As shown in FIG. 1a, the semiconductor device 100 has a semiconductor substrate 102, for example, a silicon substrate, a first gate insulative film 152 formed on the semiconductor substrate 102, a first gate electrode 154 formed thereon, a first offset spacer 156 formed on both lateral side walls of the first gate electrode 154, and a first extension region 162 formed in the region on the side of the first offset spacer 156 on the surface of the semiconductor substrate 102. The first offset spacer 156 includes a silicon nitride film 157 formed in contact with the first gate electrode 154 and an oxide protective surface 158 formed on the surface of the silicon nitride film 157. The oxidation protection film surface 158 is formed by forming the silicon nitride film 157 on the lateral side wall of the first gate electrode 154 and then oxidizing surface of the silicon nitride film 157 by oxygen plasma processing. The oxygen plasma processing is conducted under the condition that the temperature of the semiconductor substrate 102 is at a low temperature of 700° C. or lower, more preferably, 650° C. or lower. The oxygen plasma processing is conducted in an atmosphere of ozone or oxygen and a mixed atmosphere of them under the condition of applying or not applying bias. The processing time can be about from 10 sec to 10 min and, more preferably, about from 1 min to 2 min. This can make the film thickness on the surface of the oxide protective surface to such an extent of thickness as capable of keeping the SPM processing resistance and to such a thin extent as not giving an undesired effect on the width of the extension region. The thickness on the oxide protective surface can be about several Å (about 2 to 3 Å, preferably, less than 10 Å).

Successively, as shown in FIG. 1b, a first side wall 160 is formed to the lateral side wall of the first offset spacer 156.

Figure 2:
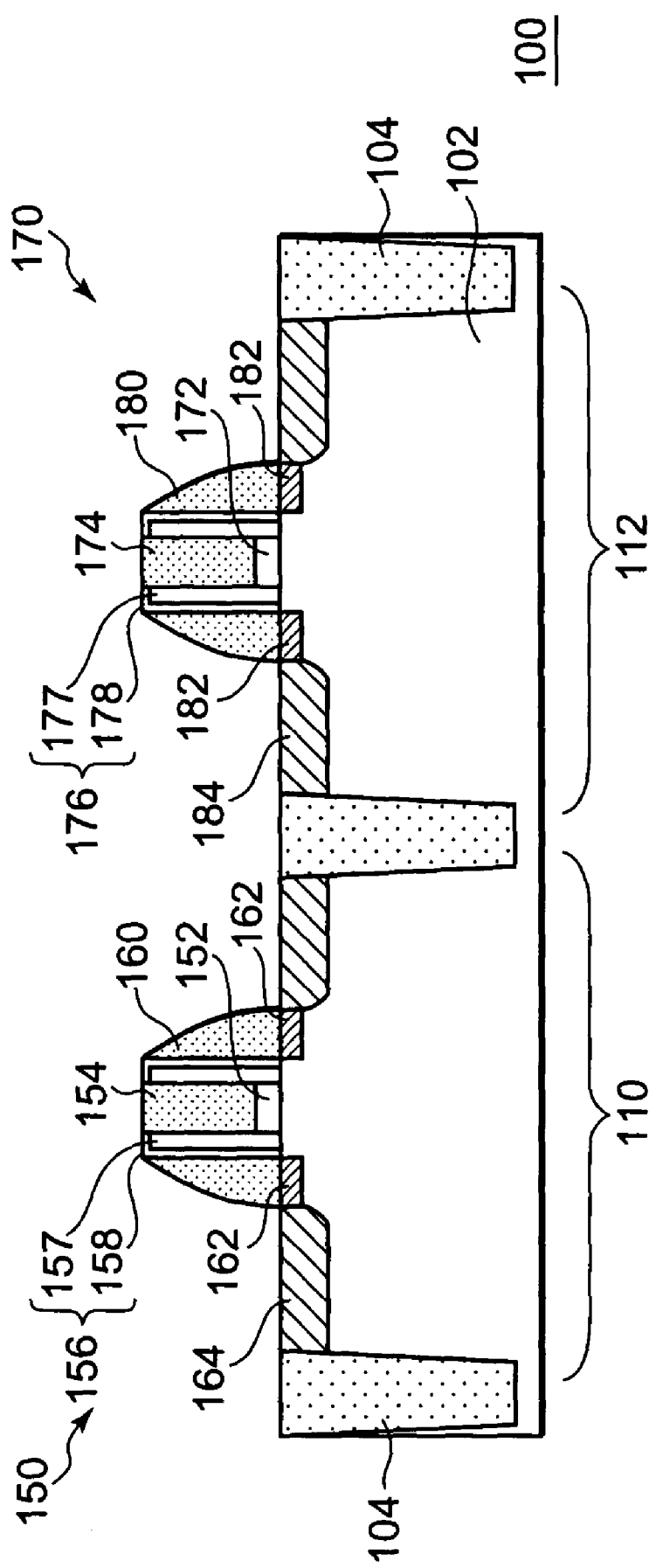
FIG. 2 is a cross sectional view showing the constitution of a semiconductor device in which two different types of transistors are formed above a semiconductor substrate in the embodiment of the invention.

FIG. 2 is a cross sectional view showing a semiconductor device 100 in this embodiment in which two different kinds of transistors are formed above the semiconductor substrate 102. In this case, a first transistor forming region 110 and a second transistor forming region 112 are disposed on the semiconductor substrate 102. A first conduction type transistor is formed in the first transistor forming region 110 and a second conduction type transistor different from the first conduction type is formed in the second transistor forming region 112. The combination of the first conduction type and the second conduction type can be P-type and N-type or vice versa.

The semiconductor device 100 includes a first transistor 150 formed in the first transistor forming region 110 and a second transistor 170 formed in the second transistor forming region 112, and a device isolation insulative film 104 for isolating the first transistor forming region 110 and the second transistor forming region 112.

The first transistor 150 has the same constitution as that shown in FIG. 1, and has a first gate insulative film 152, a first gate electrode 154, a first offset spacer 156, a first side wall 160, a first extension region 162, and a first source—drain region 164 formed in the region on the side of the first side wall 160 on the surface of the semiconductor substrate 102.

Also the second transistor 170 has the same constitution as the first transistor 150 except for the difference of the conduction type. The second transistor 170 has a second gate insulative film 172 formed on the semiconductor substrate 102, a second gate electrode 174 formed on the second gate insulative film 172, a second extension region 182 formed in the region on the side of the second offset spacer 176 on the surface of the semiconductor substrate 102, a second side wall 180 formed on the side of the second offset spacer 176, and a second source—drain region 184 formed in the region on the side of the second side wall 180 on the surface of the semiconductor substrate 102.

The second offset spacer 176 includes a silicon nitride film 177 disposed in contact with the second gate electrode 174 and an oxide protective surface 178 formed on the surface of the silicon nitride film 177. The oxide protective surface 178 is formed by forming a silicon nitride film 177 on the lateral side wall of the second gate electrode 174 and then oxidizing the surface of the silicon nitride film 177 by oxygen plasma processing.

Then, manufacturing procedures for the semiconductor device 100 shown in FIG. 2 are to be described specifically with reference to FIGS. 3a to 3l.

Figure 3A:
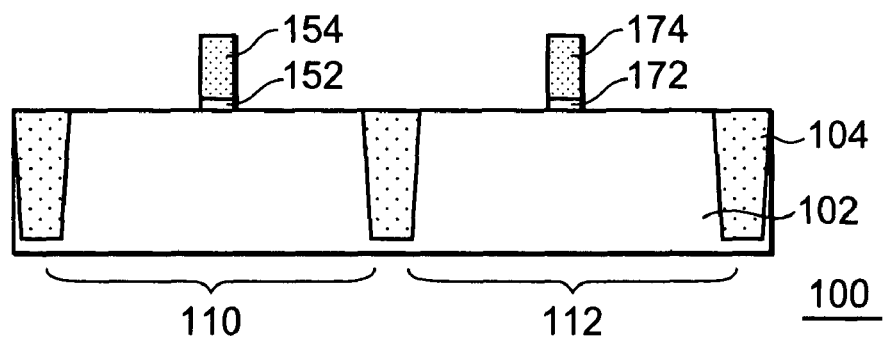
FIGS. 3a to 3l are cross sectional views showing the respective steps for manufacturing a semiconductor device shown in FIG. 2.
Figure 3B:
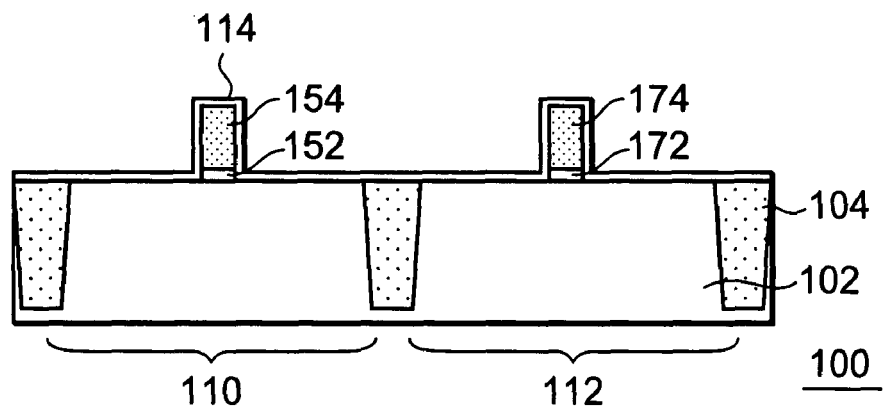

At first, a device isolation insulative film 104 is formed to the semiconductor substrate 102. Successively, after forming an insulative film as a gate insulative film and a gate electrode film as a gate electrode over the entire surface of the semiconductor substrate 102, they are patterned to form a first gate insulative film 152 and the first gate electrode 154 in the first transistor forming region 110, and the second gate insulative film 172 and the second gate electrode 174 in the second transistor forming region 112 respectively (FIG. 3a). The gate insulative film can be constituted, for example, with a silicon oxide film or a high dielectric constant film, or with a stacked film of them. Further, the gate electrode film can be constituted, for example, with a polysilicon or metal material.

Successively, a silicon nitride film 114 is formed over the entire surface above the semiconductor substrate 102 (FIG.

3b). The silicon nitride film 114 is a film that functions as an offset spacer of the first transistor 150 and the second transistor 170 subsequently. The overlap length between the gate electrode and the extension region is defined with the width of the offset spacer. Accordingly, the thickness of the silicon nitride film 114 is determined while considering the aimed value for the overlap length between the gate electrode and the extension region in the transistor as an object of manufacture.

Figure 3C:
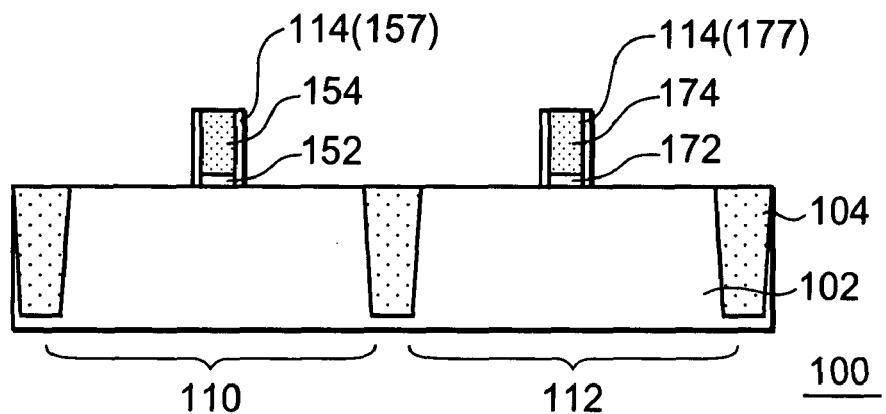

Then, the silicon nitride film 114 is etched back by etching to remove portions other than the silicon nitride film 114 on the lateral side wall portion of the gate electrode (FIG. 3c). In this case, the silicon nitride film 114 on the upper surface of the first gate electrode 154 the second gate electrode 174 is also removed. Thus, the silicon nitride film 157 and the silicon nitride film 177 are formed respectively in the first transistor forming region 110 and the second transistor forming region 112.

Figure 3D:
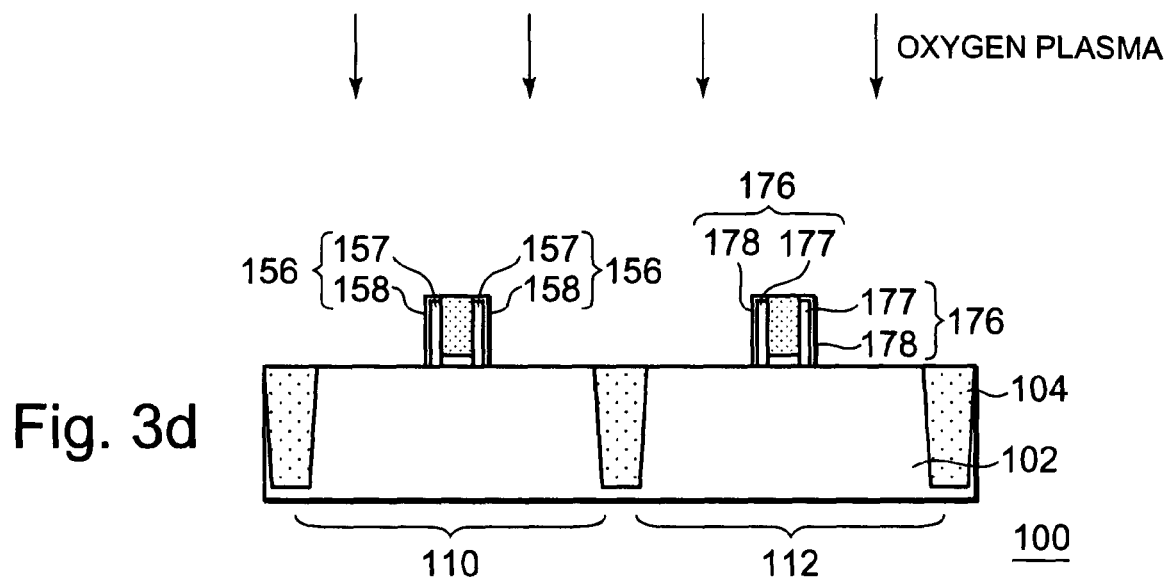

Then, the surface of the silicon nitride film 157 and the silicon nitride film 177 are oxidized by oxygen plasma processing to form an oxide protective surface 158 and an oxide protective surface 178 respectively (FIG. 3d). The oxygen plasma processing can be conducted at a temperature of 100° C. or higher (semiconductor substrate temperature). This can form the oxide protective surface 158 and the oxide protective surface 178 in a short processing time. Further, the oxygen plasma processing can be conducted at a temperature of 700° C. or lower, more preferably, 650° C. or lower (semiconductor substrate temperature). This can prevent diffusion of impurities and prevent variation of the performance of the transistors.

Figure 3E:
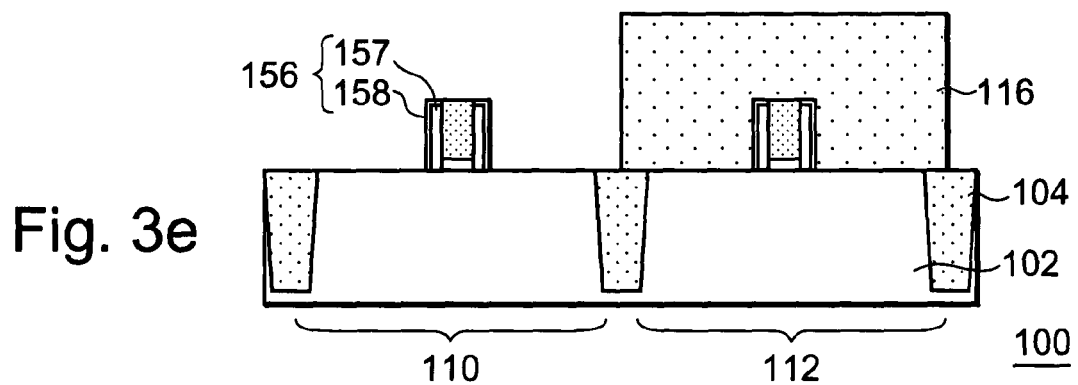
Figure 3F:
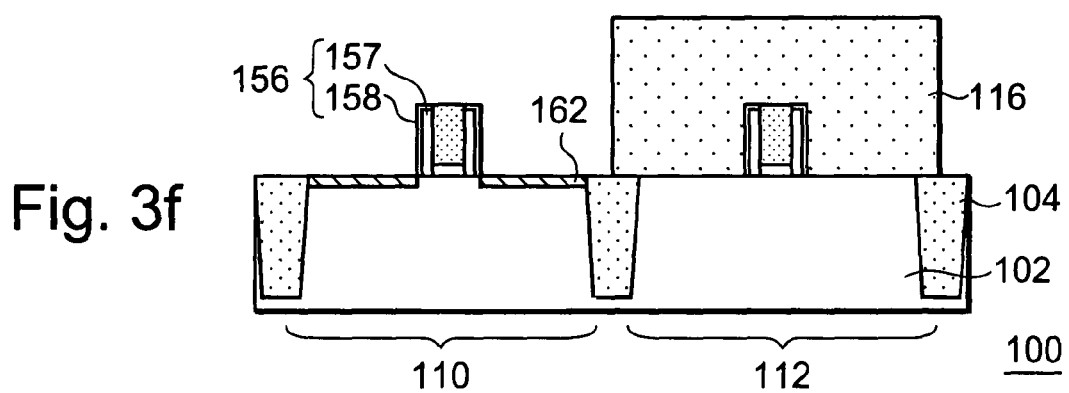

Successively, a resist film 116 is formed to the second transistor forming region to protect the second transistor forming region 112 (FIG. 3e). Then, first conduction type impurities are ion implanted over the entire surface above the semiconductor substrate 102. This forms a first extension region 162 in the first transistor forming region 110 (FIG. 3f). The impurities may be activated by annealing at 1000° C. for several seconds.

Figure 3G:
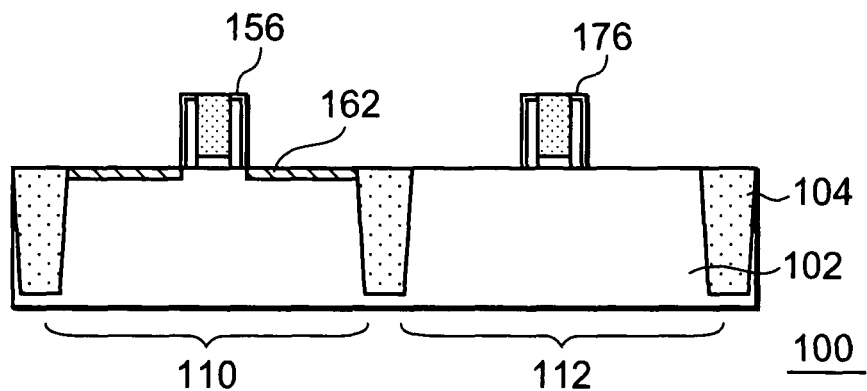

Then, the resist film 116 is removed (FIG. 3g). The resist film 116 can be removed by oxygen plasma ashing or the like. Further, after removing the resist film 116 by ashing, the entire surface of the semiconductor substrate 102 is cleaned by SPM. In this case, when the silicon nitride film of the first offset spacer 156 and the second offset spacer 176 is exposed to the surface, the silicon nitride film is etched by SPM to result in film reduction. When such film reduction is caused, the offset spacer is tapered as shown in FIG. 14 and no more functions as the offset spacer in the portion where the film thickness is thin. In this embodiment, since the oxide protective surface is formed on the surface of the silicon nitride film, such film reduction can be prevented to keep the vertical shape of the offset spacer.

Figure 3H:
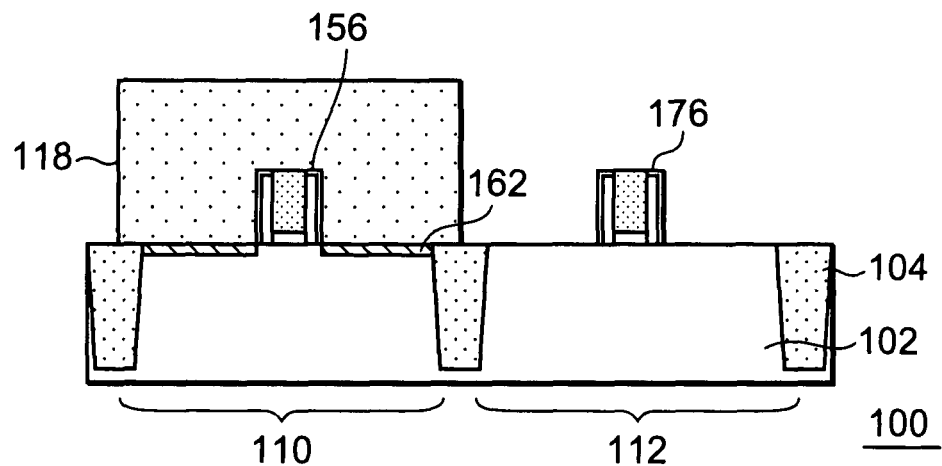
Figure 3I:
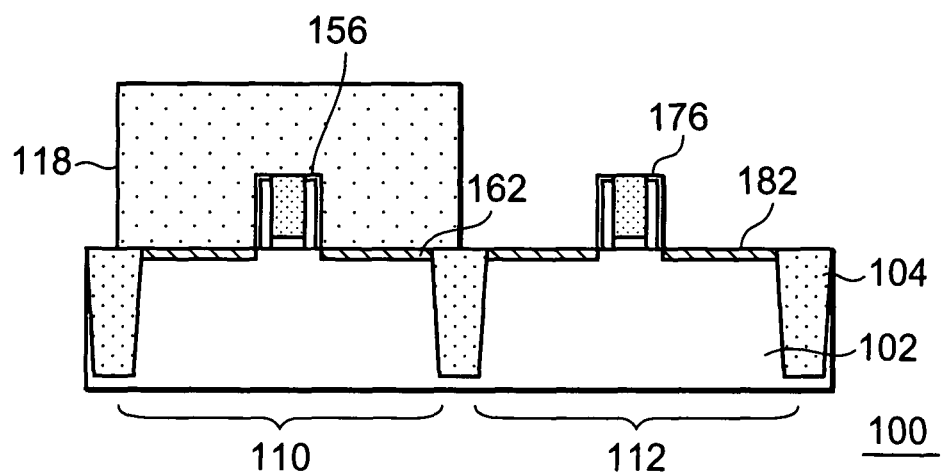

Successively, a resist film 118 is formed to the first transistor forming region 110 to protect the first transistor region 110 (FIG. 3h). Then, second conduction type impurities are ion implanted to the entire surface above the semiconductor substrate 102. This forms a second extension region 182 in the second transistor forming region 112 (FIG. 3i).

Figure 3J:
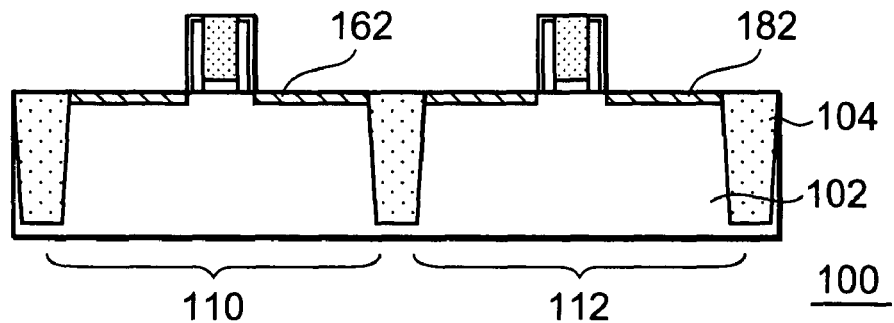

Then, the resist film 118 is removed (FIG. 3j). The resist film 118 can be removed by oxygen plasma ashing or the like. Further, after removing the resist film 118 with ashing, the entire surface of the semiconductor substrate is 102 is cleaned by SPM. In this embodiment, since the oxide protective surface is formed on the surface of the silicon nitride film, film reduction of the offset spacer can be prevented to keep the vertical shape of the offset spacer.

Ion implantation for forming each of the first extension region 162 and the second extension region 182 is not restricted to once but may be conducted plural times. While only two types of transistors of different conduction type are described herein, the semiconductor device 103 can include, for example, three or more types of transistors of different impurity ion concentrations (for example, A, B, C) although the conduction type is identical. In this case, the step of forming the extension region and the step of removing the resist film can be repeated plural time while changing the transistor forming regions to be protected by the resist film. Specifically, after ion implantation to the extension regions of transistor B and transistor C while protecting the forming region for transistor A with a resist film, the resist film is removed. Successively, after ion implantation to the extension regions of the transistor A and the transistor C while protecting the forming region for the transistor B with the resist film, the resist film is removed. This can form three types of transistors at different concentrations of ions to be implanted to the extension regions.

In a case of forming the extension regions by ion implantation for plural times as described above, the step for removing the resist film is conducted on every formation. In this case, when the offset spacer is formed of the silicon nitride film and the silicon nitride film is exposed to the surface, the film reduction of the offset spacer is caused by SPM used upon removing the resist film. Since the amount of film reduction for the offset spacer increases as the number of ion implantation increases, controls for the overlap length between the gate and the extension region becomes difficult.

According to the procedure for manufacturing the semiconductor device 100 in this embodiment, in the first offset spacer 156 and the second offset spacer 176, the oxide protective surface 158 and the oxide protective surface 178 are formed respectively of the surface. Provision of the oxide protective surface 158 and the oxide protective surface 178 can enhance the etching rate to the SPM chemical solution by about ten times compared with that of the silicon nitride film. This can prevent the film reduction of the offset spacer. This can keep the width that functions as the offset spacer as desired and the overlap length between the gate and the extension region can be controlled to a desired value. Accordingly, variation of the transistor characteristics in the manufacture can be decreased.

Further, the oxygen plasma processing for forming the oxide protective surface on the surface of the silicon nitride film can also be conducted plural times. For example, after repeating the step for forming the extension region and the step for removing the resist film plural times, the oxygen plasma processing is conducted and, further subsequently, the step of forming the extension region and the step of removing the resist film can be conducted.

Since the overlap length between the gate electrode and the extension region and the channel length in the transistor are determined depending on the width of the offset spacer, the size of the offset spacer has to be defined strictly. Accordingly, it is preferred that the thickness of the oxide protective surface is as thin as possible. On the other hand, in a case of forming plural types of transistors above the semiconductor substrate, processing of implanting impurities to other transistor forming regions in a state of protecting transistor forming regions of a portion with a resist film is repeated plural times while variously changing the combination of regions to be protected and regions to be implanted with impurities. This can efficiently form a plurality types of transistors. In this case, processing for removing the resist film is also repeated plural times. In a case of making the thickness of the oxide protective surface thin, when the processing of removing the resist film is repeated plural times and the SPM treatment is conducted on every time, the oxide protective surface may possibly be etched gradually. By conducting the oxygen plasma processing again on every conduction of resist film removing processing plural times, it is possible to keep the thickness of the oxide protective surface thin and define the size of the offset spacer strictly, as well as keep the state of the silicon oxide film protected with the oxide protective surface thereby keeping the transistor to desired characteristics. According to the procedures for manufacturing the semiconductor device in this embodiment, since the oxide protective surface is applied by the oxygen plasma processing, the processing can be conducted at a low temperature and diffusion of impurities can be prevented even when the oxygen plasma processing is conducted for plural times.

Figure 3K:
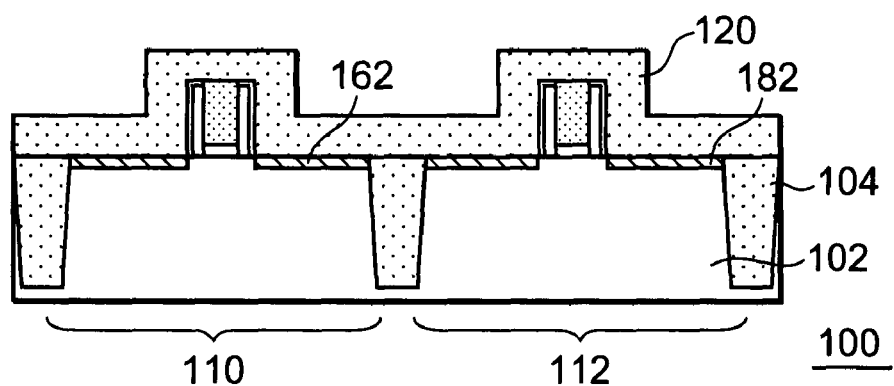
Figure 3L:
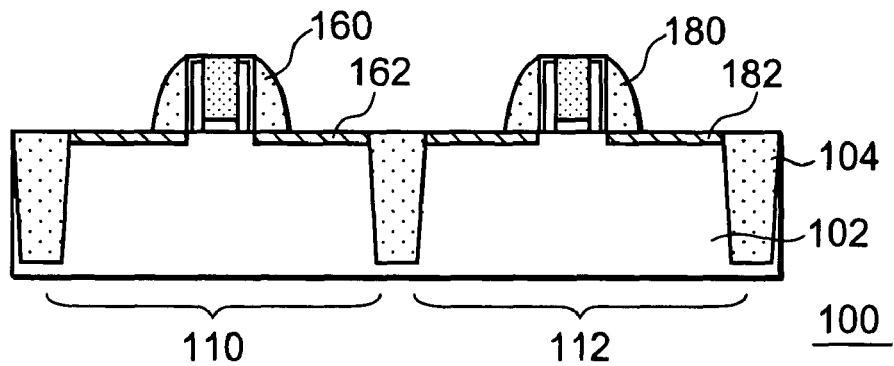

Successively, an insulative film 120 is formed over the entire surface above a semiconductor substrate 102 (FIG. 3k). The insulative film 120 for side wall can be constituted, for example, with a silicon oxide film or a silicon nitride film. Then, the insulative film 120 for side wall is etched back to form a first side wall 160 and a second side wall 180 in a first transistor forming region 110 and a second transistor forming region 112 respectively (FIG. 3l). In a case of constituting the insulative film 120 for side wall with a silicon nitride film, the oxide protective surface may also be formed by forming the first side wall 160 and the second side wall 180 and then oxidizing the surface of them by oxygen plasma processing to form the oxide protective surface. For the side wall, while it is not necessary to apply a treatment for preventing the change of shape so strictly as that for the offset spacer for deciding the channel length, the processing described above can prevent the change of the shape of the side wall by the etching of the side wall with the subsequent SPM treatment or the like.

Subsequently, a resist film is formed to the second transistor forming region 112 to protect the second transistor forming region 112 and, in this state, first conduction type impurities are ion implanted over the entire surface above the semiconductor substrate 102 in this state. Thus, the first source—drain region 164 is formed in the first transistor forming region 110. Successively, the resist film formed in the second transistor forming region 112 is removed. Also the resist film can be removed by the oxygen plasma ashing, and it can be cleaned with SPM.

Then, a resist film is formed to the first transistor forming region 110 to protect the first transistor forming region 110. Subsequently, second conduction type impurities are ion implanted over the entire surface above the semiconductor substrate 102. Thus, the second source—drain region 184 is formed in the second transistor forming region 112. Also the resist film can be removed by oxygen plasma ashing and can be cleaned with SPM. Thus, the semiconductor device 100 of the constitution shown in FIG. 2 is obtained.

Second Embodiment

This embodiment is different from the first embodiment in that the offset spacer is not disposed to some transistors.

Figure 4:
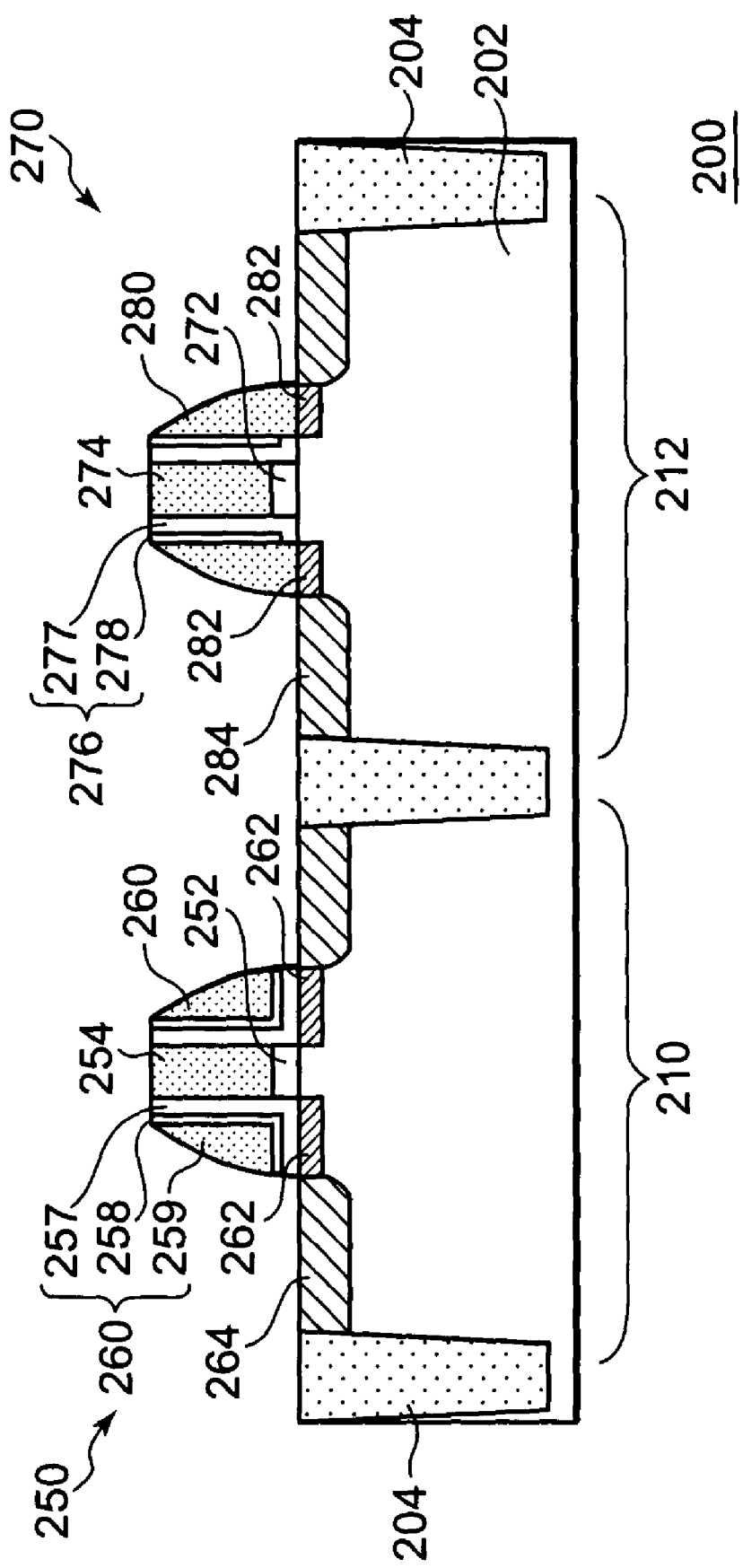
FIG. 4 is a cross sectional view showing the constitution of a semiconductor device in an embodiment of the invention.

FIG. 4 is a cross sectional view showing the constitution of a semiconductor device 200 in this embodiment.

The semiconductor device 200 includes a semiconductor substrate 202, for example, a silicon substrate, a third transistor forming region 210 and a fourth transistor forming region 212 formed on the semiconductor substrate 202, and a device isolation insulative film 204 for isolating the third transistor forming region 210 and the fourth transistor forming region 212. Further, the semiconductor device 200 includes a third transistor 250 formed above the third transistor forming region 210 and a fourth transistor 270 formed above the fourth transistor formed region 212. In this embodiment, the third transistor 250 can be a first conduction type and the fourth transistor 270 can be a second conduction type. In this case, the combination of the first conduction type and the second conduction type can be P-type and N-type or vice versa.

The third transistor 250 has no offset spacer. The third transistor 250 includes a third gate oxide film 252 formed on the semiconductor substrate 202, a third gate electrode 254 formed thereon, a third side wall 260 formed on both lateral side walls of the third gate electrode 254, a third extension region 262 formed in the region on the side of the third gate electrode 254 on the surface of the semiconductor substrate 202, and a third source—drain region 264 formed in the region on the side of the third side wall 260 on the surface of the semiconductor substrate 202. The third side wall 260 includes a silicon nitride film 257 formed on the lateral side wall of the third gate electrode 254, an oxide protective surface 258 formed on the surface of the silicon nitride film 257 and an insulative film 259 formed on the lateral side wall of the oxide protective surface 258.

The fourth transistor 270 includes a fourth gate oxide film 272 formed on the semiconductor substrate 202, a fourth gate electrode 274 formed thereon, a fourth offset spacers 276 formed on both lateral side walls of the fourth gate electrode 274, a fourth side wall 280 formed on the lateral side wall of the fourth offset spacer 276, a fourth extension region 282 formed in the region on the side of the fourth offset spacer 276 on the surface of the semiconductor substrate 202, and a fourth source—drain region 284 formed in the region on the side of the fourth side wall 280 on the surface of the semiconductor substrate 202. The fourth offset spacer 276 includes a silicon nitride film 277 formed on the lateral side wall of the fourth gate electrode 274, and an oxide protective surface 278 formed on the surface of the silicon nitride film 277. The fourth side wall 280 can be constituted with the same material as the insulative film 259 for the third side wall 260.

Figure 5A:
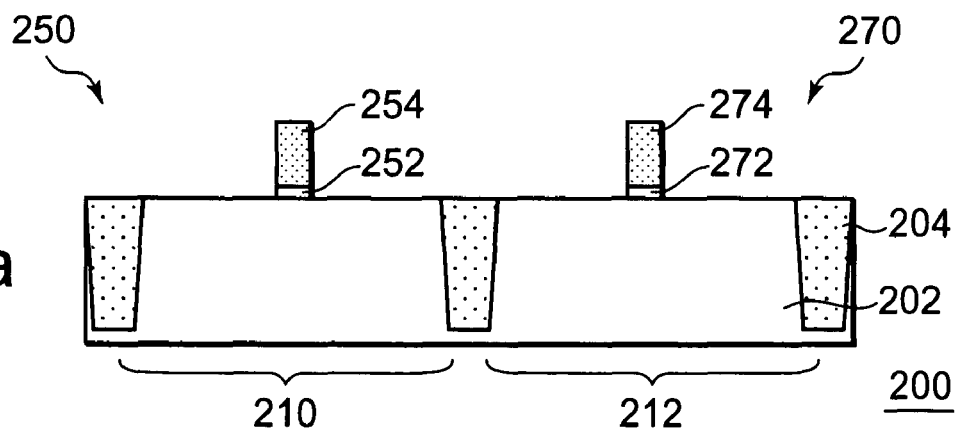
FIGS. 5a to 5n are cross sectional views showing the respective steps for manufacturing a semiconductor device shown in FIG. 4.
Figure 5B:
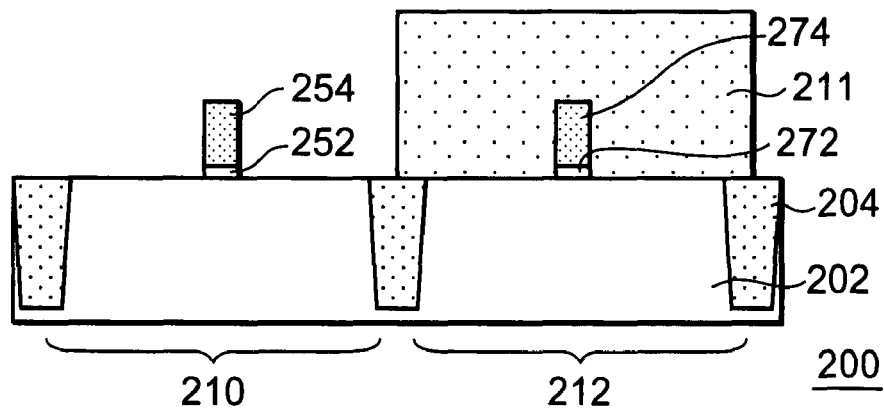
Figure 5C:
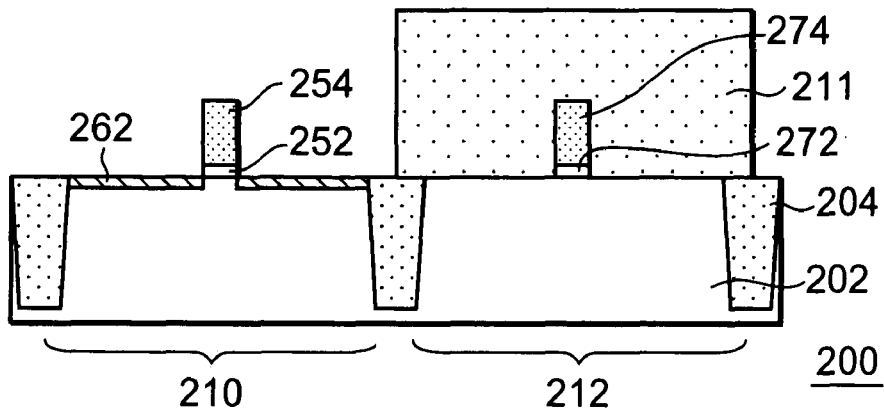
Figure 5D:
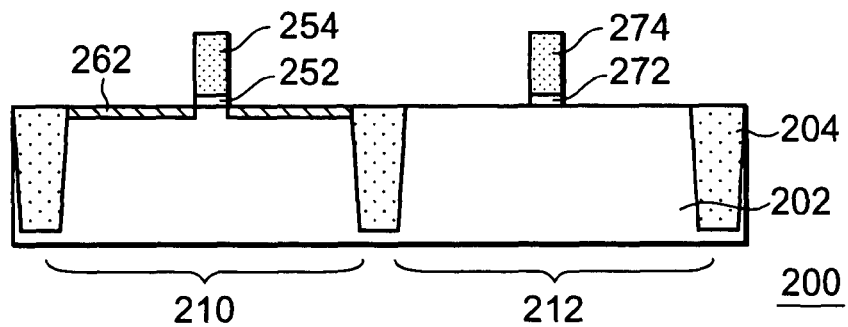
Figure 5E:
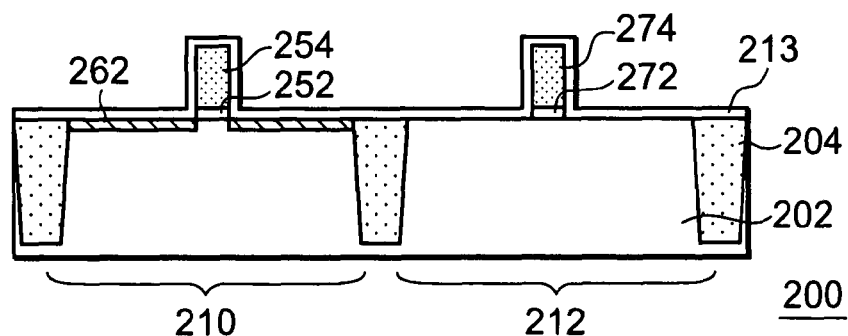
Figure 5F:
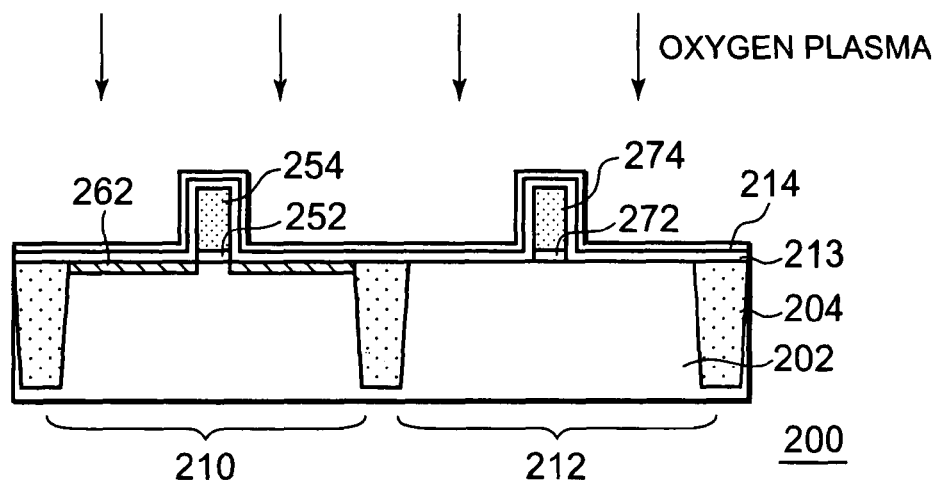
Figure 5G:
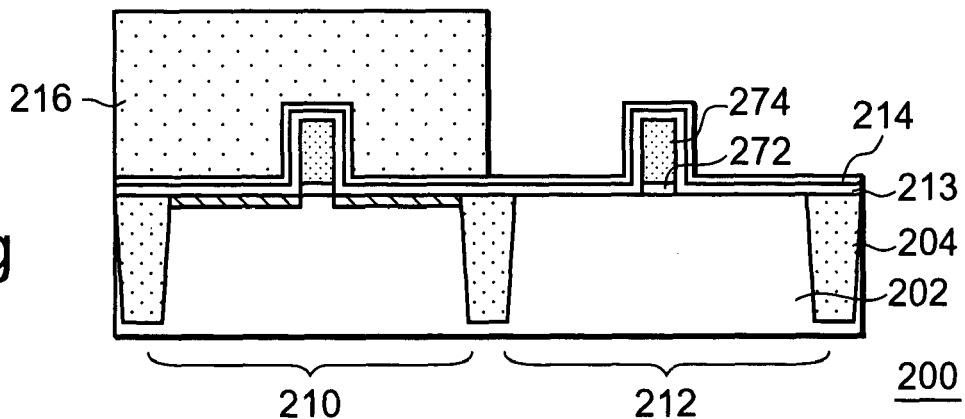
Figure 5H:
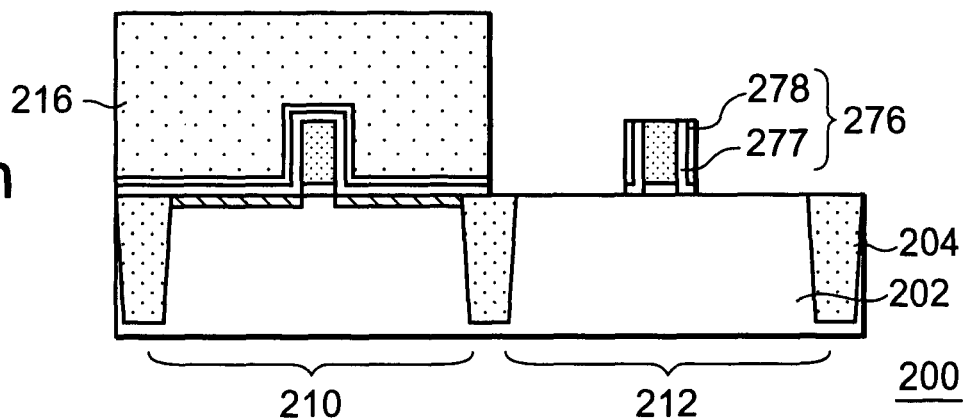
Figure 5I:
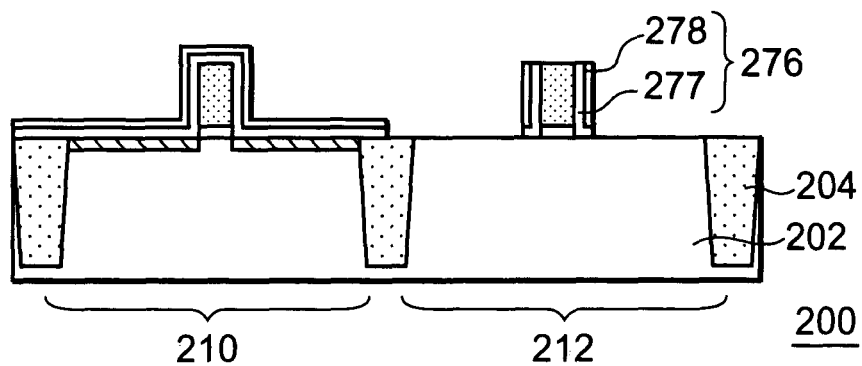
Figure 5J:
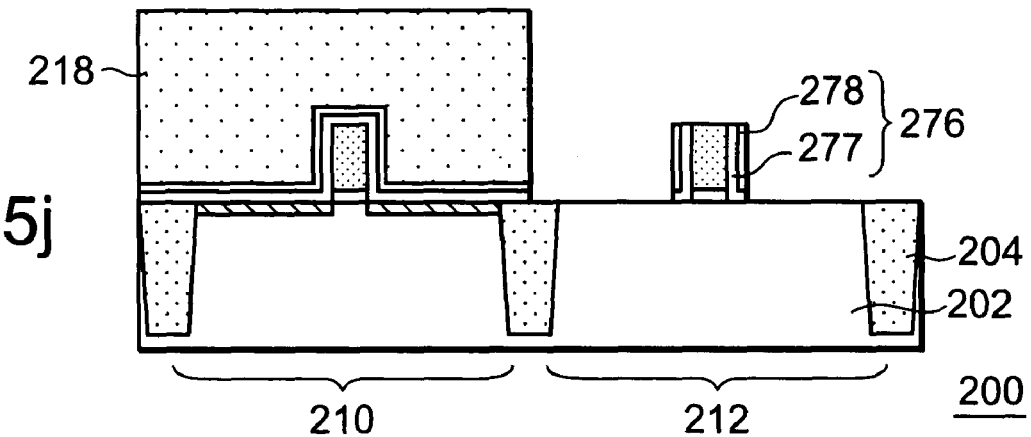
Figure 5K:
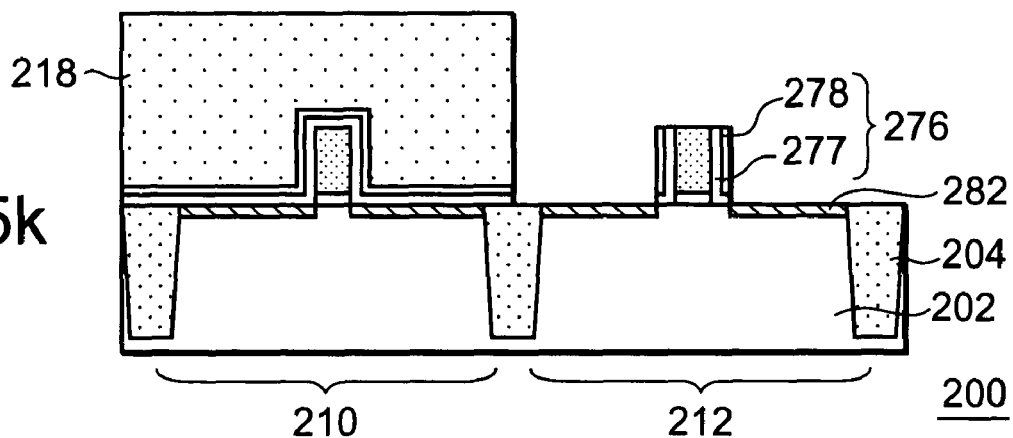
Figure 5L:
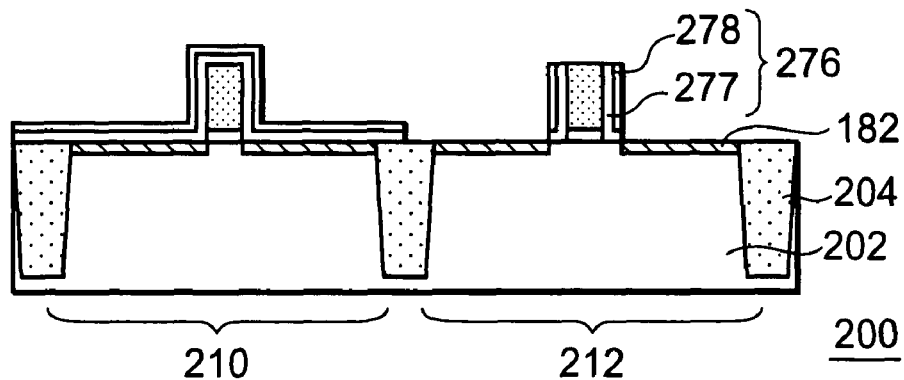
Figure 5M:
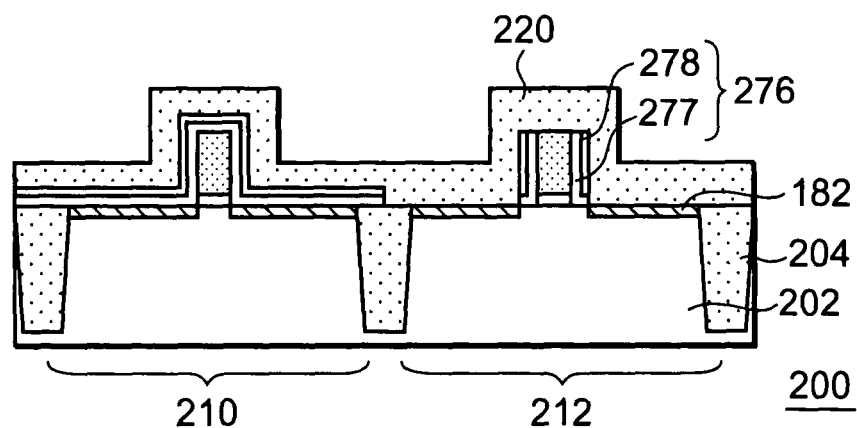
Figure 5N:
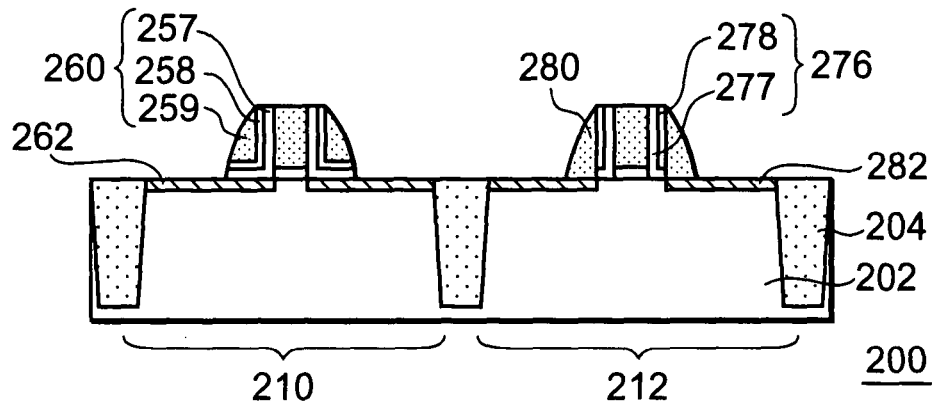

Then, procedures for manufacturing the semiconductor device 200 shown in FIG. 4 is to be described specifically with reference to FIGS. 5a to 5n.

At first, a device isolation insulative film 204 is formed to a semiconductor substrate 202. Successively, a third gate oxide film 252 and a third gate electrode 254 of a third transistor 250, as well as a fourth gate oxide film 272 and a fourth gate electrode 274 of a fourth transistor 270 are formed above the semiconductor substrate 202 (FIG. 5a). They can be formed in the same manner as described for the first embodiment.

Then, a resist film 211 is formed to the fourth transistor forming region 212 to protect the fourth transistor forming region 212 (FIG. 5b). Subsequently, first conduction type impurities are ion implanted over the entire surface above the semiconductor substrate 102. Thus, a third extension region 262 is formed in the third transistor forming region 210 (FIG. 5c).

Subsequently, the resist film 211 is removed (FIG. 5d). The resist film 211 can be removed by oxygen plasma ashing or the like. Further, after removing the resist film 211 by ashing, the entire surface of the semiconductor substrate 202 is cleaned by an SPM chemical solution.

Successively, a silicon nitride film 213 is formed over the entire surface above the semiconductor substrate 202 (FIG. 5e). The silicon nitride film 213 is a film that functions subsequently as an offset spacer for the third gate oxide film 252. Accordingly, the film thickness of the silicon nitride film 213 is determined while considering the aimed value for the overlap length between the gate electrode and the extension region in the transistor as an object of manufacture.

Then, the surface of the silicon nitride film 213 is oxidized by oxygen plasma processing to form an oxide protective surface 214 (FIG. 5f). The oxygen plasma processing can be conducted under the same conditions as those explained for the procedures of forming the oxide protective surface 158 and the oxide protective surface 178 in the first embodiment. By conducting the oxygen plasma processing at 700° C. or lower and, more preferably, 650° C. or lower, diffusion of impurities in the third extension region 262 formed in the third transistor forming region 210 can be prevented, and the third extension region 262 can be formed in a desired range. This can render the transistor characteristics of the third transistor 250 favorable.

Subsequently, a resist film 216 is formed to the third transistor forming region 210 to protect the third transistor forming region 210 (FIG. 5g). Successively, the silicon nitride film 213 and the oxide protective surface 214 formed in the fourth transistor forming region 212 are etched back to remove the portions other than the lateral side wall of the fourth gate electrode 274. Thus, a fourth offset spacer 276 constituted with a silicon nitride film 277 and an oxide protective surface 278 is formed in the fourth transistor forming region 212 (FIG. 5h).

Then, the resist film 216 is removed (FIG. 5i). The resist film 216 can also be removed by oxygen plasma ashing, and can be cleaned by SPM. In this case, since the oxide protective surface 278 is formed on the surface of the fourth offset spacer 276, the resist film 216 can be removed without film reduction by SPM.

Successively, a resist film 218 is formed above the third transistor forming region 210 to protect the third transistor forming region 210 again (FIG. 5j). Then, second conduction type impurities are ion implanted over the entire surface above the semiconductor substrate 202. Thus, a fourth extension region 282 is formed in the fourth transistor forming region 212 (FIG. 5k).

Then, the resist film 218 is removed (FIG. 5l). The resist film 218 can also be removed by oxygen plasma ashing and can be cleaned by SPM. In this case, since the oxide protective surface 278 is formed on the surface of the fourth offset spacer 276, the resist film 218 can be removed without film reduction by SPM.

Successively, an insulative film 220 for side wall is formed over the entire surface above the semiconductor substrate 202 (FIG. 5m). The insulative film 220 for side wall can be constituted with the same material as the insulative film 120 for side wall in the first embodiment. Then, the insulative film 220 for side wall is etched back to form a third side wall 260 and a fourth side wall 280 respectively in the third transistor forming region 210 and the fourth transistor forming region 212 (FIG. 5n). The third side wall 260 is constituted with an insulative film 259 formed by etching back the silicon nitride film 257, the oxide protective surface 258, and the insulative film 220 for side wall.

In a case of constituting the insulative film 220 for side wall with the silicon nitride film in the same manner as explained for the first embodiment, after forming the third side wall 260 and the fourth side wall 280, the surface thereof may be oxidized to form the oxide protective surface by oxygen plasma processing.

EXAMPLES

Example 1

An SPM treatment was conducted and the film reduction amount was measured for a sample prepared by forming a silicon nitride film on a silicon substrate, and forming an oxide protective surface of the silicon nitride film to the surface of the silicon nitride film by oxygen plasma processing (140° C.) (with $O_2$ processing), and a sample without such oxygen plasma processing (without $O_2$ processing). The conditions for the SPM chemical solution were identical with those used upon removing the resist film ($H_2SO_4$:$H_2O_2$=5:1, treating temperature, 140° C.).

Figure 6A:
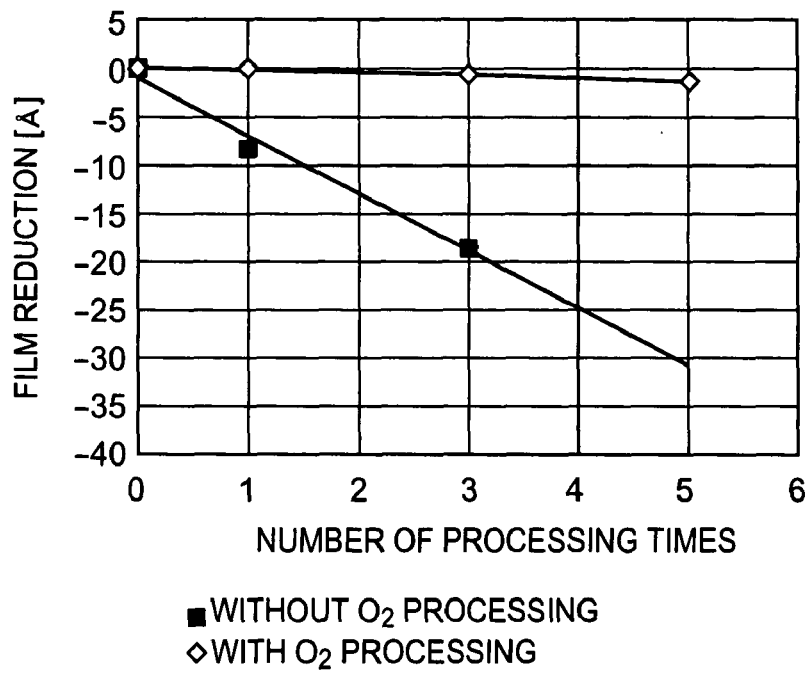
FIGS. 6a and 6b are graphs showing the result of the example according to the invention.

FIG. 6a is a graph showing a relation between the number of SPM treatment and the film reduction amount of the silicon nitride film. For the sample with $O_2$ processing, the film thickness was substantially unchanged even in a case where the treatment was conducted five times compared with the case for the treating times of 0 times. On the other hand, in a case without $O_2$ processing, the film reduction amount increased as the treating times increased and the film reduction amount was about 15 Å for the treating of three times.

Example 2

The semiconductor device 100 of the constitution shown in FIG. 1 of the first embodiment was manufactured and transistor characteristics (Ion) were measured. As the offset spacer, a silicon nitride film and a film formed with an oxide protective surface on the surface thereof by oxygen plasma processing (140° C.) were used (with $O_2$ processing). Further, as a comparative example, a sample without oxygen plasma processing after forming an offset spacer constituted with a silicon nitride film (without $O_2$ processing) was also manufactured.

Figure 6B:
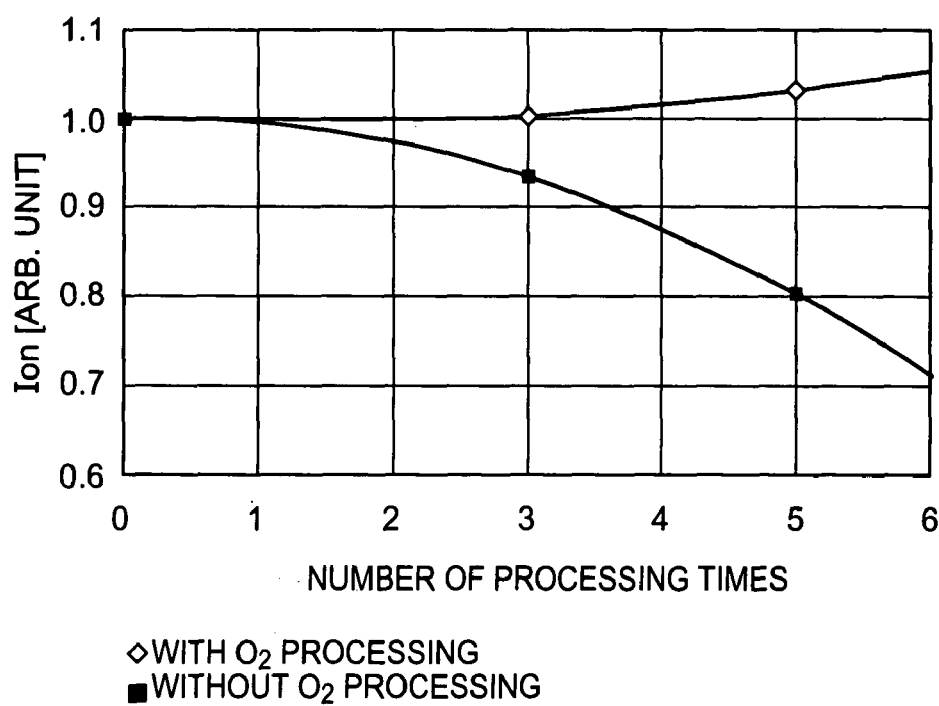
Figure 7A:
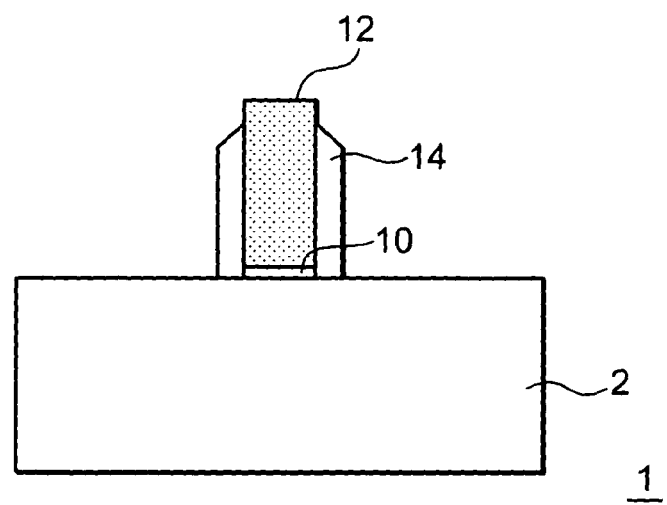
FIGS. 7a and 7b are views showing a semiconductor device of a related art.
Figure 7B:
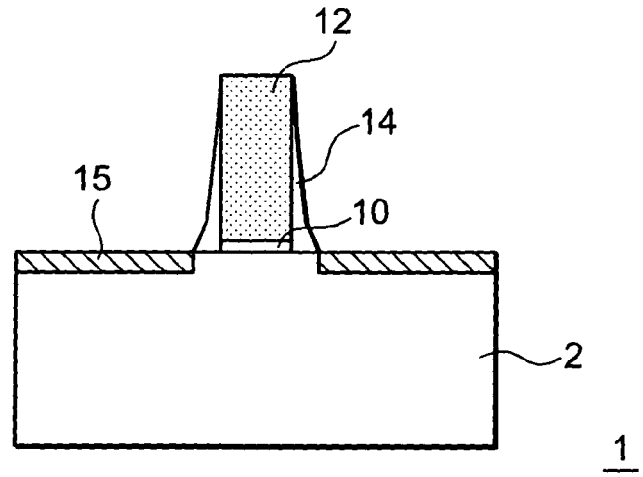

FIG. 6b is a graph showing a relation between the number of the SPM treatment times for the offset spacer and transistor characteristics (Ion). In the sample with $O_2$ processing, the transistor characteristics were scarcely fluctuated even when the number of processing times increased. On the other hand, in a case without $O_2$ processing, Ion decreased as the number of processing times increased and it was revealed that the transistor characteristics were varied.

While the embodiments of the invention have been described with reference to the drawings, they are examples of the invention and various constitutions other than those described above can also be adopted.

In the second embodiment, an example of forming the oxide protective surface 214 to the surface of the silicon nitride film 213 and then etching back them was shown as described with reference to FIGS. 6d to 6i. However, as other example, after etching back the silicon nitride film 213 so as to leave the silicon nitride film 213 only on the lateral side wall of the third gate electrode 214 and the fourth gate electrode 274, the oxide protective surface may be formed on the surface of the silicon nitride film 213 by oxygen plasma processing in the same manner as described for the first embodiment.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A method of manufacturing a semiconductor device, comprising:
    forming a silicon nitride film, capable of functioning as a spacer to each of lateral side walls of a plurality of gate electrodes formed respectively in a plurality of transistor forming regions;

oxidizing a surface of the silicon nitride film by oxygen plasma processing to form an oxide protective surface to on the silicon nitride film so that the silicon nitride film is intervened between the gate electrode and the oxide protective surface;

covering a portion of the plurality of transistor-forming regions with a resist film;

introducing impurities into an other portion of said transistor-forming regions to form a plurality of extension regions in the other portion by using the silicon nitride film with the oxide protective surface and the gate electrode, as a mask;

removing the resist film; and forming a side wall on the lateral side wall of the silicon nitride film formed with the oxide protective surface.

2. The method according to claim 1, wherein:

forming the extension regions and removing the resist film, are conducted plural times before forming the side wall.

3. The method according to claim 2, further comprising:

after repeating forming the extension regions and removing the resist film plural times, forming the oxide protective surface is conducted again.

4. The method according to claim 1, further comprising:

prior to forming the silicon nitride films, respectively, introducing impurities, while protecting a portion of the plurality of transistor-forming regions by a resist film, into the plurality of transistor-forming regions in an other portion, and forming extension regions in the plurality of transistor-forming regions by using the gate electrode as a mask; and removing the resist films.

5. The method according to claim 1, wherein:

in said portion, a transistor of a first conduction-type is formed, and in said other portion, a transistor of a second conduction-type, opposite to the first conduction-type, is formed.

6. The method according to claim 1, wherein:

the oxygen plasma processing is conducted at a temperature of the semiconductor substrate being 700° C. or lower.

7. The method according to claim 1, wherein:

removing the resist film comprises removing the resist film by asking, and cleaning an entire surface of the substrate by a chemical solution comprising a sulfuric acid and a hydrogen peroxide.

8. The method as claimed in claim 1, wherein the silicon nitride film is directly formed on the gate electrodes.

9. A method of forming a semiconductor device comprising:

forming a gate electrode on a semiconductor substrate;

forming nitride on a side surface of said gate electrode;

forming an oxide film on said nitride film, by oxidizing a surface of the nitride film with an oxygen plasma processing, so that the nitride film is intervened between the gate electrode and the oxide film, said oxide film and said nitride film constituting a spacer of said gate electrode;

introducing an impurity into said semiconductor substrate, by using said spacer as a mask, to form a lightly doped drain region for said gate electrode, wherein said oxygen plasma processing is performed at a temperature of 700° C. or lower;

after introducing said impurity, forming a resist film to cover said gate electrode and said spacer; and removing the resist film by a chemical solution comprising a sulfuric acid and a hydrogen peroxide.

10. A method of forming a semiconductor device, comprising:

forming a gate electrode on a semiconductor substrate;

forming a nitride film on a side surface of said gate electrode;

forming an oxide film on said nitride film, by oxidizing surface of the nitride film with an oxygen plasma processing, so that the nitride film is intervened between the gate electrode and the oxide film, said oxide film and said nitride film constituting a spacer of said gate electrode; and introducing an impurity into said semiconductor substrate, by using said spacer as a mask, to form a lightly doped drain region for said gate electrode, wherein the nitride film is directly formed on the gate electrode.

\* \* \* \* \*